(12) United States Patent
Kim et al.

(10) Patent No.: US 11,289,309 B2
(45) Date of Patent: Mar. 29, 2022

(54) DEVICE FOR PROVIDING GAS TO A PLASMA CHAMBER AND A PLASMA PROCESSING DEVICE INCLUDING THE SAME

(71) Applicant: SAMSUNG ELECTRONICS CO., LTD., Suwon-si (KR)

(72) Inventors: Hyung Jun Kim, Suwon-si (KR); Kwang Nam Kim, Suwon-si (KR); Sung Yeon Kim, Jeongeup-si (KR); Jong Woo Sun, Hwaseong-si (KR); Sang Rok Oh, Yongin-si (KR); Jung Pyo Hong, Gwangmyeong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 271 days.

(21) Appl. No.: 16/407,988

(22) Filed: May 9, 2019

(65) Prior Publication Data

US 2020/0135433 A1 Apr. 30, 2020

(30) Foreign Application Priority Data

Oct. 31, 2018 (KR) .................. 10-2018-0131733

(51) Int. Cl.
*H01J 37/32* (2006.01)

(52) U.S. Cl.
CPC ...... *H01J 37/32449* (2013.01); *H01J 37/321* (2013.01); *H01J 37/32816* (2013.01)

(58) Field of Classification Search
CPC .. H01J 37/321; H01J 37/328; H01J 37/32082; H01J 37/3244; H01J 37/32449
See application file for complete search history.

(56) References Cited

U.S. PATENT DOCUMENTS

| 5,304,248 | A | * | 4/1994 | Cheng | ..................... C23C 16/04 |
| | | | | | 118/728 |
| 7,867,921 | B2 | | 1/2011 | Wang et al. | |
| 8,889,023 | B2 | | 11/2014 | Matsumoto et al. | |
| 2003/0070620 | A1 | * | 4/2003 | Cooperberg | ...... C23C 16/45574 |
| | | | | | 118/723 AN |
| 2003/0079686 | A1 | * | 5/2003 | Chen | ................... C23C 16/4412 |
| | | | | | 118/715 |

FOREIGN PATENT DOCUMENTS

| JP | 07-254495 | 10/1995 |
| JP | 2007-027661 | 2/2007 |
| JP | 2016-152367 | 8/2016 |
| KR | 10-0775591 | 11/2007 |
| KR | 10-0839190 | 6/2008 |
| WO | WO 2013/162851 | 10/2013 |

\* cited by examiner

*Primary Examiner* — Yuechuan Yu
(74) *Attorney, Agent, or Firm* — F. Chau & Associates, LLC

(57) ABSTRACT

A plasma processing device is provided with a chamber including a space that is configured to perform a treatment process for a wafer. A supporting member is disposed inside of the chamber and configured to support the wafer. A gas supply unit is configured to inject a mixed gas in different directions toward the supporting member. The pressure of the mixed gas is increased by adding inert gas to reactive gas.

19 Claims, 5 Drawing Sheets

DEVICE FOR PROVIDING GAS TO A PLASMA CHAMBER AND A PLASMA PROCESSING DEVICE INCLUDING THE SAME

CROSS-REFERENCE TO RELATED APPLICATION

This application claims benefit of priority under 35 U.S.C. § 119 to Korean Patent Application No. 10-2018-0131733 filed on Oct. 31, 2018 in the Korean Intellectual Property Office, the disclosure of which is incorporated by reference herein in its entirety.

TECHNICAL FIELD

The present inventive concept relates to a device for providing gas to a plasma chamber, and more particularly, to a device for providing gas to a plasma chamber and a plasma processing device including the same.

DISCUSSION OF RELATED ART

As semiconductor processing becomes more advanced, the ability to control the gas dispersion of a wafer processing device is increasingly important. In an ICP type chamber, a temperature of an electrostatic chuck (ESC) in direct contact with a wafer has been used as a main process control parameter. However, a temperature control system is limited in gas dispersion control ability.

SUMMARY

According to an exemplary embodiment of the present inventive concept, a plasma processing device is provided with a chamber that includes a space configured to perform a treatment process for a wafer. A supporting member is disposed inside of the chamber and configured to support the wafer. A gas supply unit is configured to inject a mixed gas in different directions toward the supporting member. The pressure of the mixed gas is increased by adding inert gas to reactive gas.

According to an exemplary embodiment of the present inventive concept, a device for providing gas to a plasma chamber includes an inert gas supply unit for supplying inert gas. A gas ratio controller supplies reactive gas and control a supply amount of the reactive gas to, maintain the inert gas and the reactive gas at a predetermined ratio. An inert gas supply line is extended from the inert gas supply unit. A reactive gas supply line is extended from the gas ratio controller. A mixed gas supply line connects the inert gas supply line to the reactive gas supply line to supply a mixed gas to a mixed gas injection portion disposed in a chamber.

According to an exemplary embodiment of the present inventive concept, a plasma processing device is provided with a chamber including a first mixed gas injection portion. The first mixed injection portion may include an inlet hole and a flow rate controller coupled to the first mixed injection portion for adjusting flow rate of mixed gas through the inlet hole. A mixed gas supply line connects to the first mixed gas injection portion. A reactive gas supply line and an inert gas supply line are coupled to the mixed gas supply line. An inert gas supply unit is coupled to the inert gas supply line. A pressure of the mixed gas flowing into the chamber through the first mixed gas injection portion is determined primarily by a volume of inert gas and an adjusted size of the inlet hole.

BRIEF DESCRIPTION OF DRAWINGS

The above and other aspects and features of the present disclosure will be more clearly understood from the following detailed description, taken in conjunction with the accompanying drawings, in which.

DETAILED DESCRIPTION

Figure 1:
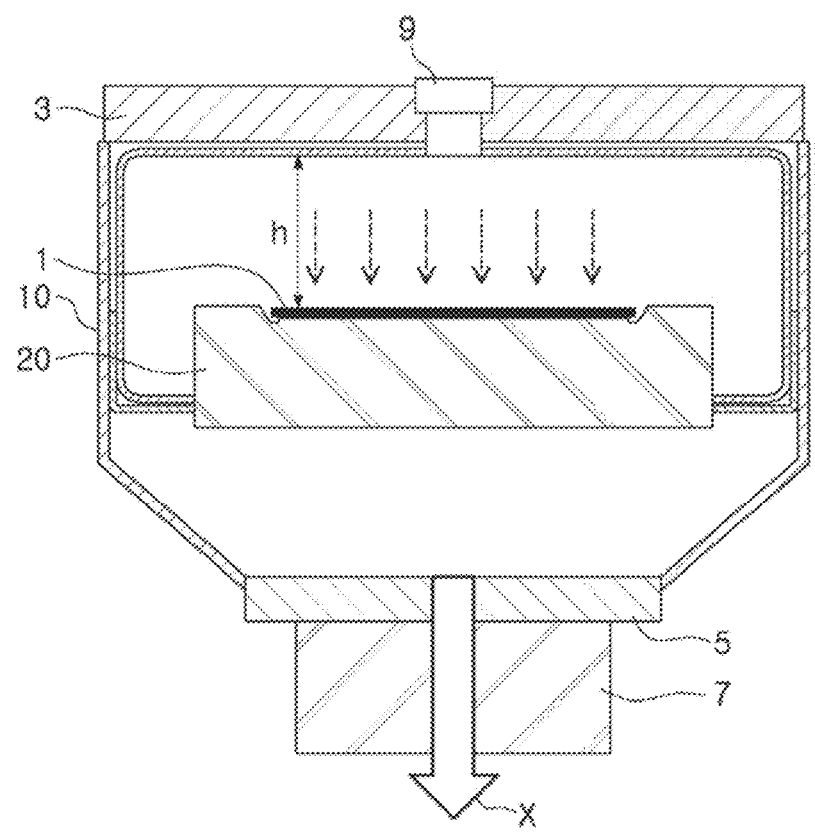
FIG. 1 is a schematic view illustrating an ICP type chamber used in a semiconductor process.
Figure 2:
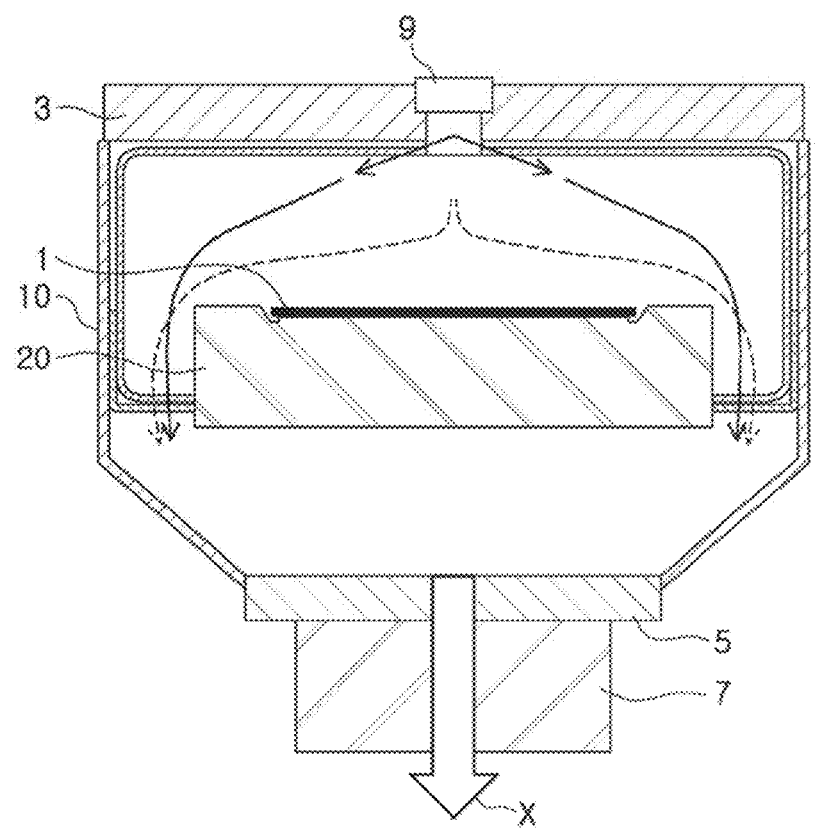
FIG. 2 is a schematic view illustrating gas flow inside an ICP type chamber according to a comparative example.

FIG. 1 is a schematic view illustrating an ICP type chamber used in a semiconductor process, and FIG. 2 is a schematic view illustrating gas flow inside an ICP type chamber according to a comparative example.

A treatment process of a wafer may be performed by a capacitor coupled plasma (CCP) type chamber or an inductively coupled plasma (ICP) type chamber.

In a CCP type chamber, a method may be used in which a capacitor causes electrode discharge and generates plasma. As a distance between a wafer and an electrode is reduced in a CCP type chamber, plasma is more easily generated. A CCP type chamber may include a structure in which a distance between a wafer and an electrode is relatively short, thus gas dispersion is controlled.

On the other hand, when an ICP type chamber is employed, the process may include a method of using a coil to mate an induced magnetic field to generate plasma. In an ICP type chamber, an induced magnetic field of sufficient strength generates plasma. A gap within the ICP type chamber is structurally required to generate plasma. Thus, as illustrated in FIG. 1, an ICP type chamber may include a chamber 10, a window disk 3 disposed on a surface of the chamber 10 and an automatic expansion valve (ACP) 5 disposed at a surface of the chamber 10 opposite to the window disk 3. A gas discharge portion 7 may be disposed on the ACP 5 to permit exhaust X to be discharged from the chamber 10, and a mixed gas injection portion 9 may be disposed on the window disk 3 for injecting mixed gas into the chamber 10. A supporting member 20 may be disposed inside a chamber 10 to support a wafer 1. The chamber 10 may include a gap having a height h of about 150 mm or more is disposed between a surface of a wafer 1 to an upper end of a chamber 10. An ICP type chamber is also referred to as "a high gap plasma etch chamber" for this reason.

In such an ICP type chamber, pressure inside the chamber 10 is lower than the gas source, even when reactive gas is injected through a nozzle. Because a gap disposed inside the ICP type chamber may have a height h from a surface of the wafer 1 to an upper end of the chamber 10, dispersion by gas flow is not easily controlled. In most cases, a process is performed at a pressure of about 1 mT to 100 mT inside a chamber 10 of the plasma chamber. In this case, gas flow inside an ICP type chamber may follow a Knudsen flow pattern. In Knudsen flow, laminar flow and molecular flow are provided together.

As illustrated in FIG. 2, during a process in which injected gas is exposed to a surface of a wafer 1 in an ICP chamber 10 having a high gap structure and low pressure, a problem may occur in which gas is scattered and dispersed around the wafer 1 rather than onto a surface of the wafer 1. For example, even when gas is strongly injected so as to have laminar flow when ejected from a nozzle, gas flow is easily transformed into molecular flow form having been scattered and dispersed due to a semiconductor process being performed in an ICP chamber environment with relatively low pressure, and a high gap. Thus, the process in which injected gas is exposed to a surface of a wafer 1 is not easily controlled.

Figure 3:
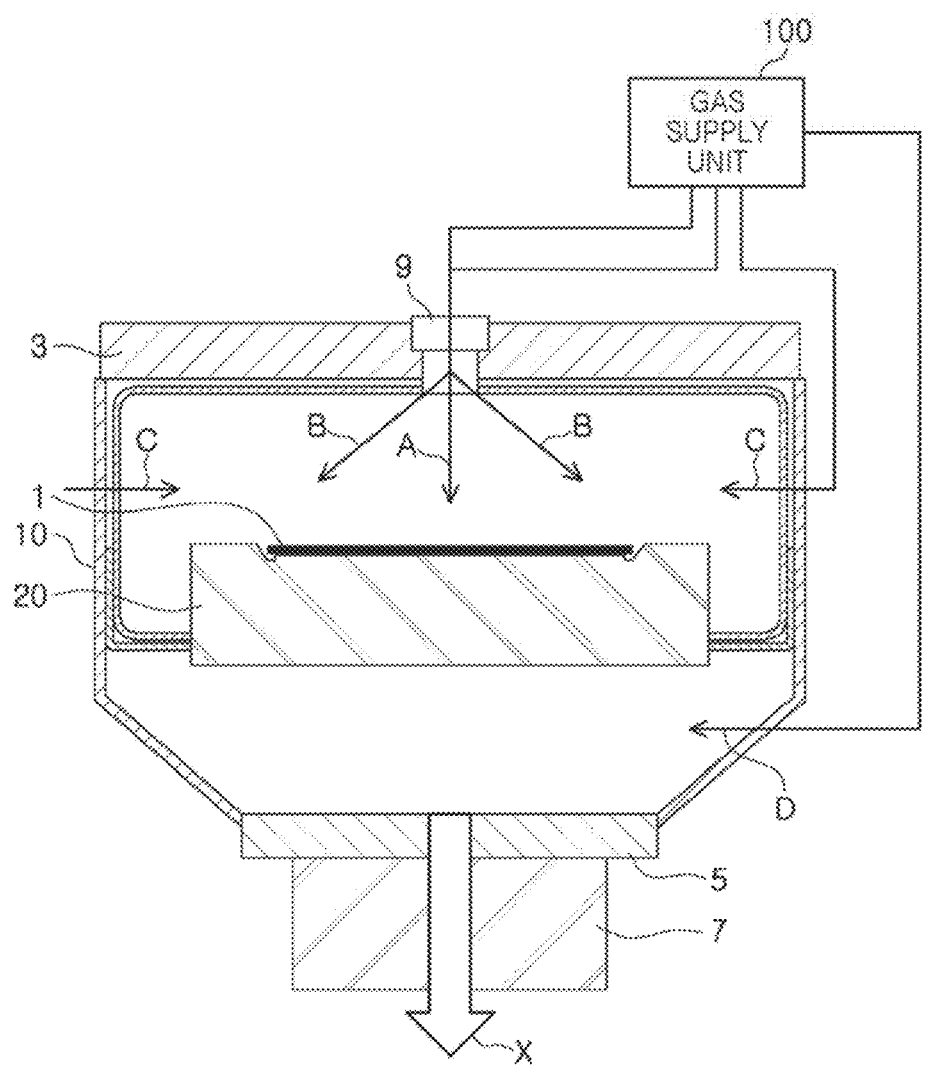
FIG. 3 is a schematic view illustrating a state in which gas is infected into a chamber into a plasma processing device according to an example embodiment of the present inventive concept.
Figure 4:
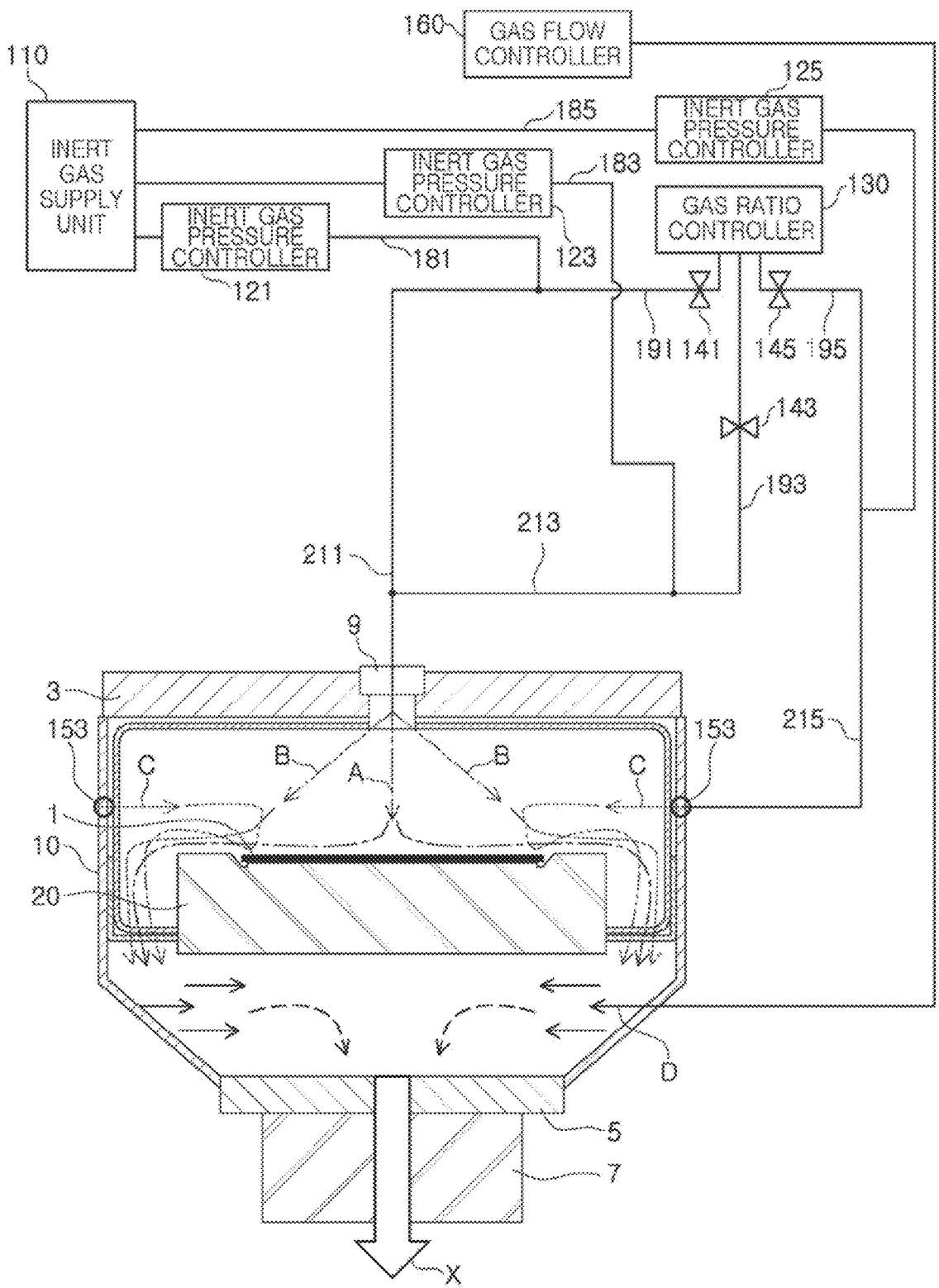
FIG. 4 is a schematic view illustrating a device for providing gas to a plasma chamber and a plasma processing device including the same according to an example embodiment of the present inventive concept.
Figure 5:
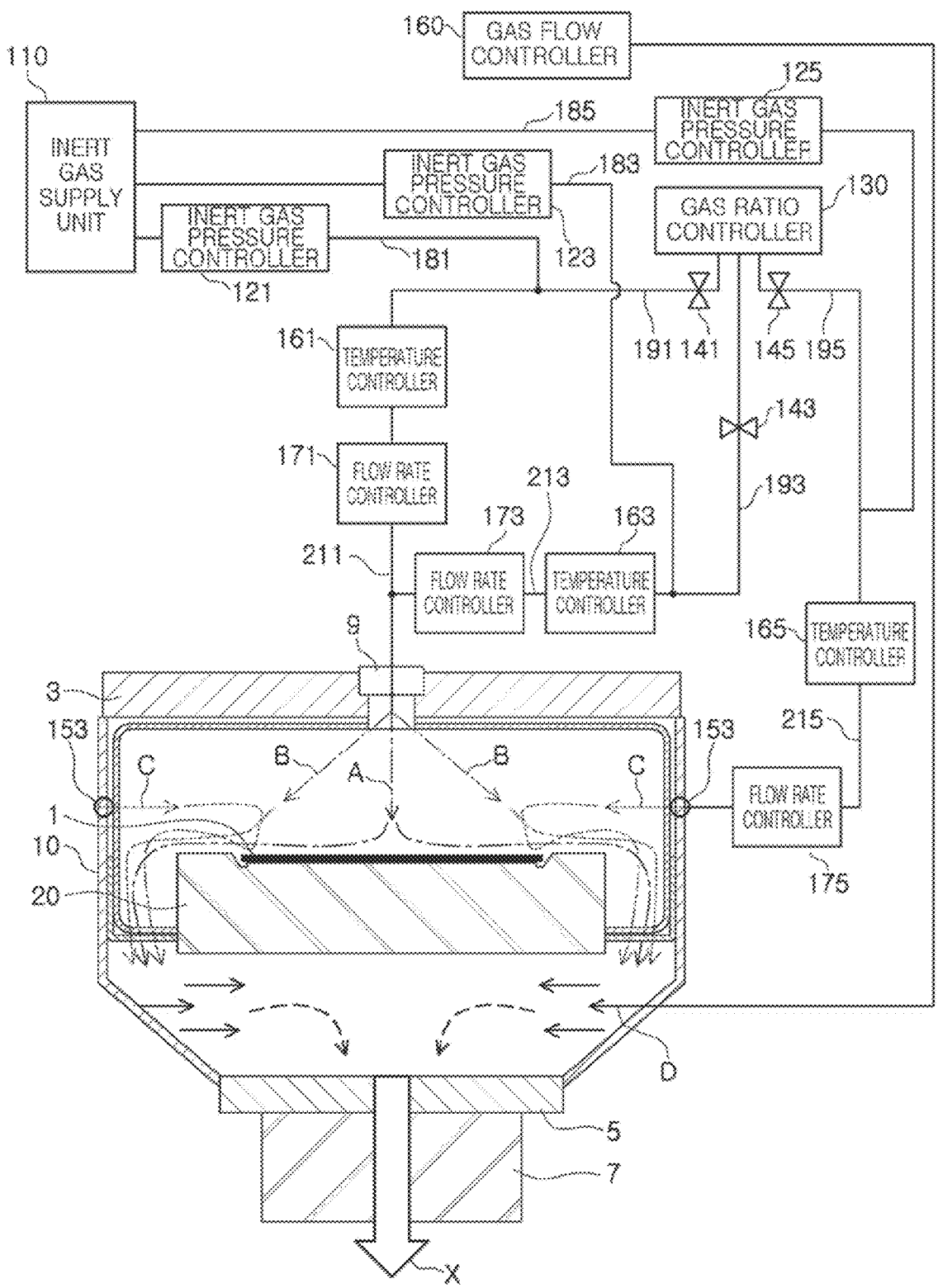
FIG. 5 is a schematic view illustrating a device for providing gas to a plasma chamber and a plasma processing device including the same according to an example embodiment of the present inventive concept.

FIG. 3 is a schematic view illustrating a state in which gas is injected into a chamber in a plasma processing device according to an example embodiment of the present inventive concept. FIG. 4 is a schematic view illustrating a device a plasma processing device according to an example embodiment of the present inventive concept. FIG. 5 is a schematic view illustrating a plasma processing device according to an example embodiment of the present, inventive concept.

A plasma processing device according to an example embodiment of the present inventive concept includes a chamber 10, a supporting member 20, and a gas supply unit 100. The chamber 10 may include a space in which a process for treating the wafer 1 is performed. The chamber 10 may be an ICP chamber, but the inventive concept is not limited thereto. For example, the chamber 10 may be any type of plasma chamber in which a wafer is processed by gas etching. The supporting member 20 may be disposed inside the chamber 10 and may provide support to the wafer 1. The gas supply unit 100 injects mixed gas into the interior of the chamber 10. Pressure of the mixed gas is increased by adding inert gas to reactive gas and dispersing the mixture into the chamber 10 toward the supporting member 20 in various directions (e.g. A, B, C), as illustrated in FIG. 3. The gas supply unit 100 provides gas to a plasma chamber described with reference to FIGS. 4 and 5 below. A detailed description of the gas supply unit 100 will be specifically described below.

A plasma processing device according to another example embodiment of the inventive concept may include a chamber 10, a first gas supply unit, and/or a second gas supply unit.

The chamber 10 provides a space for a treatment process of the wafer 1 to be performed, and may include a first space and a second space, not completely isolated from each other. The first space may be defined as an upper space of the chamber 10 in which the treatment process of a wafer 1 is performed. Mixed gas is injected into the first space, the pressure of which may be increased by adding inert gas to reactive gas. The second space may be defined as a lower space of the chamber 10 in which low reactive gas or inert gas is supplied. The second space may be spatially separated from the first space described above, but is not necessarily completely isolated from the first space. For example, the gas injected into the first pace may eventually flow into the second space.

The first gas supply unit and the second gas supply unit may have at least some mutual components, according to a device for providing gas to a plasma chamber described with reference to FIGS. 4 and 5 below. Thus, a detailed description of the first gas supply unit as may also be applied to the second gas supply unit will be described below.

Referring to FIG. 4, a device for providing gas to a plasma chamber according to an example embodiment of the present inventive concept may include an inert gas supply unit 110, a gas ratio controller 130, inert gas supply lines 181, 183, and 185, reactive gas supply lines 191, 193, and 195, as well as mixed gas supply lines 211, 213, and 215.

According to an exemplary embodiment of the present inventive concept, as depicted in FIGS. 4 and 5, the number of inert gas supply lines 181, 183, and 185, reactive gas supply lines 191, 193, and 195, as well as mixed gas supply lines 211, 213, and 215 is illustrated as three. However, the inventive concept is not limited thereto. For example, the number of a mixed gas injection portions for transferring gas into a chamber 10 may be one or more than three. However, as illustrated in reference to FIGS. 4 and 5 according to an example embodiment of the present inventive concept, gas may be injected into a chamber 10 in three different directions A, B, C through different mixed gas injection portions 9 and 153.

The inert gas supply unit 110 may store inert gas and may also supply the inert gas during a semiconductor treatment process. Pressure, at which inert gas is supplied to the chamber 10, is controlled by the inert gas pressure controllers 121, 123, and 125, and described in further detail below.

The gas ratio controller 130 may store reactive gas as well as supply the reactive gas during a semiconductor treatment process. In this case, the gas ratio controller 130 may control the amount of the reactive gas supplied in order to achieve a predetermined ratio of inert gas relative to reactive gas.

Each inert gas supply line 181, 183, and 185 may extend from the inert gas supply unit 110, and may connect to a reactive gas supply line 191, 193, and 195. The reactive gas supply lines 191, 193, and 195 may extend from the gas ratio controller 130, and may connect to the inert gas supply lines 181, 183, and 185, respectively. When the inert gas supply lines and the reactive gas supply lines are provided in plural, the plurality of inert gas supply lines 181, 183, and 185, and the plurality of reactive gas supply lines 191, 193, and 195 may be connected to each other, respectively.

The mixed gas supply lines 211, 213, and 215 may connect to the mixed gas injection portions 9 and 153 disposed in a chamber 10. When the inert gas supply lines 181, 183, and 185 and the reactive gas supply lines 191, 193, and 195 are provided in plural, the mixed gas supply lines 211, 213, and 215 also supply mixed gas to a plurality of mixed gas injection portions 9 and 153, by connecting one among a plurality of inert gas supply lines 181, 183, and 185 to one among a plurality of reactive gas supply lines 191, 193, and 195.

The reactive gas refers to a gas used in a treatment process for etching or manufacturing a semiconductor pattern and may include, for example, carbon tetrafluoride ($CF_4$). The inert gas refers to non-reactive gas. For example, the inert gas may include at least one group 18 gas, such as Ar and/or He. The inert gas may also include oxygen ($O_2$) and/or nitrogen ($N_2$).

The reactive gas is injected into a chamber 10 at a preset pressure in consideration of a molecular weight of the gas prior to a semiconductor treatment process. Although supply pressure is fixed in advance, a pressure of a reactive gas injected into a chamber typically has a lower value. Thus, when reactive gas at low pressure is injected into a chamber, gas may not reach a target point (such as a semiconductor wafer), and a phenomenon in which the gas is dispersed inside the chamber may occur, as illustrated in the comparative example of FIG. 2.

In a device for providing gas to a plasma chamber according to an example embodiment of the present inventive concept, the inert gas stored in the inert gas supply unit 110 is supplied at appropriate pressure during a semiconductor treatment process. Mixed gas, including reactive gas and inert gas, is injected into the chamber 10 at an appropriate pressure. Since supply pressure of the added inert gas may be independently controlled, the mixed gas in which inert gas and reactive gas are mixed may be controlled to be injected at high pressure. Thus, by a device for providing gas to a plasma chamber according to an example embodiment of the present inventive concept, gas may be injected at a higher pressure than a supply pressure in the case in which reactive gas only is supplied to a chamber 10. Accordingly, a Knudsen flow phenomenon occurring in the case in which reactive gas only is injected into the chamber may be decreased.

The device for providing gas to a plasma chamber according to an example embodiment of the present inventive concept may further include at least one inert gas pressure controller. For example, the inert gas pressure controllers 121, 123, and 125 may be disposed at the inert gas supply lines 181, 183, and 185 to control the supply pressure of inert gas. In the case in which a supply direction of mixed gas is set to a plurality of directions (e.g. A, B, C) as illustrated in FIGS. 4 and 5, the inert gas pressure controllers 121, 123, and 125 may be coupled to the inert gas supply lines 181, 183, and 185, respectively. Thus, the injection pressure of mixed gas may be separately adjusted depending on a direction in which gas is injected into a chamber.

A plurality of mixed gas injection portions may be disposed at, different positions, of a chamber 10 to inject mixed gas into the chamber 10 in different directions. For example, the mixed gas injection portions 9 and 153 may inject mixed gas, supplied from the mixed gas supply lines 211, 213, and 215, into the chamber 10 in different directions (e.g. A, B, C). Illustrated in FIGS. 4 and 5, the mixed gas injection portion 9 is disposed at an upper side of the chamber 10, and the mixed gas injection portion 153 is disposed at a lateral side of the chamber 10. However, the present disclosure is not limited thereto. According to an exemplary embodiment of the present inventive concept, the mixed gas injection portions 9 and 153 may be provided in the singular, or may be provided in a number greater than that which is illustrated, and may also be disposed at various different locations of the chamber 10. For example, the mixed gas injection portion 9 might be disposed at an area other than an upper side of the chamber 10.

Alternatively, a single mixed gas injection portion may inject mixed gas into a chamber 10 in different directions. A single mixed gas injection portion 9 may inject mixed gas, supplied from the plurality of mixed gas supply lines 211, 213, and 215, into the chamber 10 in different directions. For example, as illustrated in FIGS. 4 and 5, the mixed gas injection portion 9, disposed at an upper side of the chamber 10, may inject mixed gas, supplied from the mixed gas supply line 211 and the mixed gas supply line 213, in an A-direction and a B-direction.

The device for providing gas to a plasma chamber according to an example embodiment of the present inventive concept may further include at least one backflow preventing portion. The backflow preventing portion prevents inert gas from flowing back to the gas ratio controller 130. A backflow of gas occurring when the pressure of inert gas supplied from the inert gas supply unit 110 is higher than the pressure of reactive gas supplied from the gas ratio controller 130 is prevented. When a plurality of reactive gas supply lines 191, 193, and 195 are provided, the backflow preventing portions 141, 143, and 145 are also disposed at at least one or more or all among the reactive gas supply lines 191, 193, and 195. The backflow preventing portions 141, 143, and 145 may include, for example, a valve.

Referring to FIG. 5, the device for providing gas to a plasma chamber according to an example embodiment of the present inventive concept may further include at least one temperature controller. As illustrated in FIG. 5, when a plurality of mixed gas supply lines 211, 213, and 215 are provided, the temperature controllers 161, 163, and 165 may be coupled to the mixed gas supply lines 211, 213, and 215, respectively.

The temperature controllers 161, 163, and 165 control a temperature of mixed gas, supplied through the mixed gas supply lines 211, 213, and 215, to a level suitable for a semiconductor process. Since a problem in reproducibility may occur when a temperature condition, is changed in a semiconductor process, proper maintenance of a process temperature is required to ensure reliability of a semiconductor process. The temperature controllers 161, 163, and 165 may, include, for example, a heater.

Referring to FIG. 5, the device for providing gas to a plasma chamber according to an example embodiment of the present inventive concept may further include at least one flow rate controller. As illustrated in FIG. 5, when a plurality of mixed gas supply lines 211, 213, and 215 are provided, the flow rate controllers 171, 173, and 175 may also be coupled to the mixed gas supply lines 211, 213, and 215, respectively.

The flow rate controllers 171, 173, and 175 change a size of an inlet hole of the mixed gas injection portion to control a flow rate of mixed gas. For example, in order to increase a rate at which mixed gas is injected into a chamber, a size of a hole of a mixed gas injection portion is narrowed. On the other hand, in order to lower an injection rate, the size of a hole of a mixed gas injection portion is widened.

According to an example embodiment of the present inventive concept, as described above, a flow rate of mixed gas is controlled through the flow rate controllers 171, 173, and 175. Thus, supply pressure of inert gas is controlled, thereby ultimately contributing to prevention of occurrence of Knudsen flow inside a chamber 10 and operation of the inert gas pressure controllers 121, 123, and 125 controlling pressure of mixed gas.

Referring to FIG. 4 or FIG. 5, the mixed gas supplied through the device for providing gas to a plasma chamber, according to an example embodiment of the present inventive concept, flows in a manner similar to A, B, and C after being injected into the chamber 10. Due to operation of at least one or more of the inert gas pressure controllers 121, 123, and 125 and/or the flow rate controllers 171, 173, and 175, occurrence of Knudsen flow inside a chamber is prevented.

In contrast, as illustrated in FIG. 2, gas injected according to a Knudsen flow effect, is discharged without having appropriate pressure to reach a wafer 1 disposed in a chamber 10. However, when pressure and flow rate of mixed gas are controlled, as illustrated in FIGS. 4 and 5, the mixed gas is able to be injected into a chamber 10 and onto a water 1 with appropriate pressure and/or a flow rate as controlled by the user. In other words, gas supply pressure is increased or an injection rate is increased. Thus, as compared with the case in which reactive gas only is injected, which is inevitably supplied at low pressure, gas dispersion may be easily controlled during a semiconductor process.

According to example embodiments of the present inventive concept, as illustrated iii FIGS. 4 and 5, an injection direction of gas may include three directions (e.g. A, B, C). For example, mixed gas may be injected toward each of a center portion, a middle portion, and an edge portion of a wafer. The mixed gas injection portion 9 and the mixed gas injection portion 153 may be disposed in an upper portion and a side portion of a chamber 10, respectively, but the present disclosure is not limited thereto. Alternatively, points in which the mixed gas injection portions 9 and 153 are disposed may be changed depending on a position of the wafer in the chamber 10.

Referring to FIG. 4 or FIG. 5, the device for providing gas to a plasma chamber according to example embodiments of the present inventive concept may either include a gas flow controller. The gas flow controller 160 supplies low reactive gas or inert gas into the chamber 10 in a different position from positions in which the mixed gas is injected into the chamber 10 through injection portions 9 and 153. The positions, in which the mixed gas injection portions 9 and 153 are installed may refer to the first space of a chamber 10 in which a process for treating a wafer 1 is performed by injecting mixed gas. The position at which the gas flow controller 160 supplies low reactive gas or inert gas into the chamber 10 is different from the positions at which the mixed gas injection portions 9 and 153 supply mixed gas, and may refer to a second space of the chamber 10. The second space of the chamber 10 might not be completely isolated from the first space so as to allow gas injected into the first space to flow thereinto. However, the first and second space of the chamber 10 may be spatially separated from one another as described above. For example, the first space may refer to an upper portion of, a chamber 10 and the second space may refer to a lower portion of a chamber 10.

Referring to the exemplary embodiment of the present inventive concept as illustrated in FIGS. 4 and 5, the first space is a space formed above the supporting member 20, while the second space is a space formed below the supporting member 20 in which gas injected into the chamber 10 converges before being discharged in stream X. The gas flow controller 160 supplies low reactive gas or inert gas to the second space in a direction D, thereby controlling the time in which reactive gas stays in the first space. Thus, a period of overall process response may be controlled, and conductance inside a chamber is controlled. This is based on the fact that there is a limitation in flux which a gas discharge portion 7 is able to suck and discharge. The low reactive gas or inert gas, supplied to the second space, may include Ar, He and/or $N_2$.

A supply amount of the low reactive gas or inert gas supplied by the gas flow controller 160 may be adjusted as required. For example, when the period of the overall process response is required to be increased or decreased, a supply amount of low reactive gas or inert gas may be increased or decreased accordingly.

According to an example embodiment of the plasma processing device described above, the gas supply unit 100 may include, for example, an inert gas supply unit 110, inert gas pressure controllers 121, 123, and 125, a gas ratio controller 130, and a gas flow controller 160, in order to supply gas in the A, B, C, and D directions as illustrated in FIG. 3. Moreover, the plasma processing, device may further include a first injection portion 9, in which mixed gas is injected into the chamber in the A and B directions, and a second injection portion 153 disposed at a position different from that of the first injection portion, in which mixed gas is injected the chamber in a C direction. Furthermore, the plasma processing device may further include at least one or more among each of: the backflow preventing portions 141, 143, and 145, the temperature controllers 161, 163, and 165, and the flow rate controllers 171, 173, and 175.

In the plasma processing device described above according to another example embodiment of the present inventive concept, the first gas supply unit 100 may include an inert gas supply unit 110, inert gas pressure controllers 121, 123, and 125, as well as a gas ratio controller 130, in order to supply gas in different directions (e.g. A, B, and C directions) as illustrated in FIG. 3, and may further include at least one among: backflow preventing portions 141, 143, and 145; temperature controllers 161, 163, and 165; and flow rate controllers 171, 173, and 175. Moreover, in the plasma processing device described above according to an example embodiment of the present inventive concept, the second gas supply unit may include, for example, a gas flow controller 160 to supply gas D in FIG. 3.

In the device for providing gas to a plasma chamber and a plasma chamber using the same according to an example embodiment of the present inventive concept, pressure, flux, flow rate, temperature, and the direction of gas, injected into a chamber 10 may be controlled.

While example embodiments of the present inventive concept have been shown and described above, it will be understood by one of ordinary skill in the art that modifications and variations in form and detail may be made without departing from the spirit and scope of the present inventive concept.

What is claimed is:
1. A plasma processing device, comprising:
a chamber including a space that is configured to perform a treatment process for a wafer;
a supporting member disposed inside of the chamber and configured to support the wafer; and
a gas supply unit including an inert gas supply unit supplying inert gas, and a gas ratio controller supplying reactive gas and controlling a supply amount of the reactive gas, and configured to inject a mixed gas from a first portion of the chamber that is above the supporting member in different directions toward the supporting member;
a gas flow controller supplying low reactive gas or inert gas from a second portion of the chamber that is below the supporting member; and
a gas discharge port disposed within the second portion of the chamber and configured to discharge the low reactive gas or inert gas from the chamber,
wherein the pressure of the mixed gas is controlled by adding inert gas to reactive gas, and
wherein the gas discharge port discharges the low reactive gas or inert gas from a bottom of the second portion of the chamber in a direction away from the supporting member and the gas flow controller supplies the low reactive gas or inert gas to the second portion of the chamber in a direction perpendicular to the direction that the gas discharge port discharges the low reactive gas or inert gas from the chamber.
2. The plasma processing device of claim 1, wherein the gas supply unit includes an inert gas pressure controller controlling supply pressure of the inert gas.
3. The plasma processing device of claim 2, wherein the gas supply unit further includes a backflow preventing portion disposed between the gas ratio controller and an intersection of an inert gas supply line and a reactive gas supply line to prevent the inert gas from flowing toward the gas ratio controller.

4. The plasma processing device of claim 1, wherein the gas supply unit includes:
   a first injection portion disposed at a first position of the chamber in which the mixed gas is injected into the chamber; and
   a second injection portion disposed at a second position of the chamber in which the mixed gas is injected into the chamber.

5. The plasma processing device of claim 4, wherein the first injection portion injects mixed gas in a first direction and a second direction different from the first direction, and wherein the second injection portion injects mixed gas in a third direction, different from the first direction and the second direction.

6. The plasma processing device of claim 4, further comprising a temperature controller coupled to a mixed gas supply line, wherein the mixed gas supply line is connected to the first injection portion and/or the second injection portion.

7. The plasma processing device of claim 4, further comprising a flow rate controller coupled to at least one of the first injection portion and the second injection portion,
   wherein the first injection portion and the second injection portion each include an inlet hole, and
   wherein the flow rate controller controls a size of the inlet hole of at least one of the first injection portion and the second injection portion.

8. A device for providing gas to a plasma chamber, comprising:
   an inert gas supply unit supplying inert gas;
   a gas ratio controller supplying reactive gas, and controlling a supply amount of the reactive gas;
   an inert gas supply line extended from the inert gas supply unit;
   a reactive gas supply line extended from the gas ratio controller;
   a mixed gas supply line connecting the inert gas supply line to the reactive gas supply line to supply a mixed gas to a mixed gas injection portion disposed in a first portion of a chamber that is above a supporting member configured to support a wafer;
   a gas flow controller supplying low reactive gas or inert gas from a second portion of the chamber that is below the supporting member;
   a gas discharge port disposed within the second portion of the chamber and configured to discharge the low reactive gas or inert gas from the chamber,
   wherein the gas discharge port discharges the low reactive gas or inert pas from a bottom of the second portion of the chamber in a direction away from the supporting member and the gas flow controller supplies the low reactive as or inert gas to the second portion of the chamber in a direction perpendicular to the direction that the gas discharge port discharges the low reactive gas or inert gas from the chamber.

9. The device for providing gas to a plasma chamber of claim 8, wherein each of the inert gas supply line, the reactive gas supply line, the mixed gas injection portion, and the mixed gas supply line are provided in plural, and
   wherein at least one of the plurality of mixed gas injection portions injects the mixed gas supplied from the plurality of mixed gas supply lines into the chamber in different directions.

10. The device for providing gas to a plasma chamber of claim 9, further comprising: an inert gas pressure controller coupled to at least one among the plurality of inert gas supply lines to control supply pressure of the inert gas.

11. The device for providing gas to a plasma chamber of claim 9, further comprising: a backflow preventing portion coupled to at least one of the plurality of reactive gas supply lines to prevent the inert gas from flowing toward the gas ratio controller.

12. The device for providing gas to a plasma chamber of claim 9, further comprising: a temperature controller coupled to at least one of the plurality of mixed gas supply lines to control a temperature of the mixed gas.

13. The device for providing gas to a plasma chamber of claim 9, wherein the mixed gas injection portions each include an inlet hole, wherein a flow rate controller is coupled to the least one of the plurality of mixed gas injection portions to control a size of the inlet hole.

14. The device for providing gas to a plasma chamber of claim 9, further comprising a gas discharge port disposed within the second portion of the chamber.

15. The device for providing gas to a plasma chamber of claim 9, wherein at least one among the plurality of mixed gas injection portions is disposed in an upper portion of the chamber, and at least one among the plurality of mixed gas injection portions is disposed in a side portion of the chamber.

16. The device for providing gas to a plasma chamber of claim 15, wherein the at least one mixed gas injection portion disposed in an upper portion of the chamber injects mixed gas supplied from two mixed gas supply lines of the plurality of mixed gas supply lines in two or more different directions.

17. A plasma processing device, comprising:
   a chamber including a first and second space in which a process for a wafer supported by a supporting member is performed in the first space, wherein the first space and the second space are not completely isolated from each other, and wherein the first space and the second space are separated by the supporting member;
   a first gas supply unit injecting a mixed gas in different directions in the first space, wherein a pressure of the mixed gas is controlled by adding inert gas to reactive gas;
   a second gas supply unit for injecting low reactive gas or inert gas into the second space; and
   a gas discharge port disposed within the second space and configured to discharge the low reactive gas or inert gas from the chamber,
   wherein the gas discharge port discharges the low reactive gas or inert gas from a bottom of the second space in a direction away from the supporting member and the second gas supply unit supplies the low reactive gas or inert gas to the second space in a direction perpendicular to the direction that the gas discharge port discharges the low reactive gas or inert gas from the chamber.

18. The plasma processing device of claim 17, wherein the first gas supply unit includes:
   an inert gas supply unit supplying inert gas; and
   an inert gas pressure controller controlling a supply pressure of the inert gas.

19. The plasma processing device of claim 18, wherein the first gas supply unit further includes:
   a gas ratio controller supplying reactive gas, and controlling a supply amount of the reactive gas; and a backflow preventing portion disposed between the gas ratio controller and an intersection of an inert gas supply line and a reactive gas supply line to prevent the inert gas from flowing toward the gas ratio controller.

\* \* \* \* \*